(12) United States Patent
Hekmatshoartabari et al.

(10) Patent No.: US 10,243,096 B2
(45) Date of Patent: Mar. 26, 2019

(54) CRACK-TOLERANT PHOTOVOLTAIC CELL STRUCTURE AND FABRICATION METHOD

(71) Applicant: International Business Machines Corporation, Armonk, NY (US)

(72) Inventors: Bahman Hekmatshoartabari, White Plains, NY (US); Ning Li, White Plains, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 15/497,310

(22) Filed: Apr. 26, 2017

(65) Prior Publication Data
US 2017/0229603 A1     Aug. 10, 2017

Related U.S. Application Data

(62) Division of application No. 14/936,900, filed on Nov. 10, 2015, now Pat. No. 9,705,013.

(51) Int. Cl.
*H01L 31/18* (2006.01)
*H01L 31/028* (2006.01)
(Continued)

(52) U.S. Cl.
CPC ........ *H01L 31/1868* (2013.01); *H01L 31/028* (2013.01); *H01L 31/02167* (2013.01);
(Continued)

(58) Field of Classification Search
CPC .......... H02S 50/10; H02S 50/15; H02S 50/00; H01L 31/208; H01L 31/18–31/1896;
(Continued)

(56) References Cited

U.S. PATENT DOCUMENTS

| 5,269,852 A | 12/1993 | Nishida |
| 5,468,652 A | 11/1995 | Gee |

(Continued)

FOREIGN PATENT DOCUMENTS

| CN | 101752447 A | 6/2010 |
| CN | 102751371 A | 10/2012 |
| JP | 2011243970 A | 12/2011 |
| KR | 101358561 B1 | 1/2014 |

OTHER PUBLICATIONS

Taguchi, M. et al., "HIT Cells: High-Efficiency Crystalline Si Cells with Novel Structure," Prog. Photovolt: Res. Appl., 2000, vol. 8, pp. 503-513.

(Continued)

*Primary Examiner* — Eric R Smith
(74) *Attorney, Agent, or Firm* — Scully, Scott, Murphy & Presser, P.C.; L. Jeffrey Kelly, Esq.

(57) ABSTRACT

After forming an absorber layer containing cracks over a back contact layer, a passivation layer is formed over a top surface of the absorber layer and interior surfaces of the cracks. The passivation layer is deposited in a manner such that that the cracks in the absorber layer are fully passivated by the passivation layer. An emitter layer is then formed over the passivation layer to pinch off upper portions of the cracks, leaving voids in lower portions of the cracks.

19 Claims, 3 Drawing Sheets

(51) Int. Cl.

| | | |
|---|---|---|
| *H01L 31/068* | (2012.01) | |
| *H01L 31/075* | (2012.01) | |
| *H01L 31/0216* | (2014.01) | |
| *H01L 31/0224* | (2006.01) | |
| *H01L 31/0352* | (2006.01) | |
| *H01L 31/0745* | (2012.01) | |
| *H01L 31/0392* | (2006.01) | |
| *H01L 31/0445* | (2014.01) | |
| *H02S 50/10* | (2014.01) | |

(52) U.S. Cl.
CPC ............ *H01L 31/022425* (2013.01); *H01L 31/022441* (2013.01); *H01L 31/03529* (2013.01); *H01L 31/03921* (2013.01); *H01L 31/035281* (2013.01); *H01L 31/0445* (2014.12); *H01L 31/068* (2013.01); *H01L 31/075* (2013.01); *H01L 31/0745* (2013.01); *H01L 31/1804* (2013.01); *H01L 31/186* (2013.01); *H02S 50/10* (2014.12); *Y02E 10/547* (2013.01)

(58) Field of Classification Search
CPC ............ H01L 31/1892; H01L 31/206; H01L 31/0747; H01L 31/0682; H01L 31/077; H01L 31/022458
See application file for complete search history.

(56) References Cited

U.S. PATENT DOCUMENTS

| | | | |
|---|---|---|---|
| 5,674,325 | A | 10/1997 | Albright et al. |
| 6,023,020 | A | 2/2000 | Nishitani et al. |
| 6,566,162 | B2 * | 5/2003 | Yamada ............ H01L 31/0322 257/E31.007 |
| 8,372,226 | B2 | 2/2013 | Gumm |
| 2004/0112423 | A1 | 6/2004 | Suzuki et al. |
| 2010/0116335 | A1 | 5/2010 | Sinha |
| 2011/0312120 | A1 | 12/2011 | Weiner et al. |
| 2012/0032168 | A1 * | 2/2012 | Cho ............ H01L 31/0352 257/49 |
| 2012/0048336 | A1 | 3/2012 | Ito |
| 2012/0097236 | A1 | 4/2012 | Hu et al. |
| 2012/0138128 | A1 | 6/2012 | Wu et al. |
| 2014/0042594 | A1 | 2/2014 | Ayotte et al. |
| 2014/0306306 | A1 | 10/2014 | Gershon et al. |

OTHER PUBLICATIONS

Taguchi, M. et al.,"An approach for the higher efficiency in the HIT cells," Photovoltaic Specialists Conference, 2005 Conference Record of the 31st IEEE, pp. 866-871.

List of IBM Patents or Patent Applications Treated as Related, dated Apr. 26, 2017, 2 pages.

* cited by examiner

US 10,243,096 B2

CRACK-TOLERANT PHOTOVOLTAIC CELL STRUCTURE AND FABRICATION METHOD

BACKGROUND

The present application relates to photovoltaic devices, and more particularly to a thin film photovoltaic device using a cracked absorber layer.

Photovoltaic cells are devices that generate electric power from electromagnetic energy (e.g., sunlight) incident thereon. Thin film photovoltaic devices employing thin layers of semiconductor material with a thickness in a range from a few nanometers to tens of micrometers have been developed to minimize the amount of semiconductor material used to fabricate the photovoltaic devices. Since very small quantities of semiconductor materials are used, costs of thin film photovoltaic devices can be lower than those for silicon-based bulk devices.

Thin film photovoltaic devices contain an active layer (i.e., absorber layer) which is of a light absorbing material that generates charge carriers upon exposure to light. One challenge faced in fabrication of thin film photovoltaic devices is the ability to produce a defect-free absorber layer. The absorber layer is typically formed by a spalling process in which a thin layer of a semiconductor material that provides the absorber layer is exfoliated or peeled from a thicker base substrate. However, due to the mechanical frangibility of the thin film, it is very difficult to produce a crack-free absorber layer at a thickness range of interest (typically less than 50 µm). Photovoltaic devices utilizing the crack-containing absorber layers can suffer from poor performance because the cracks can contain material from later formed conductive layers, causing electrical shorts across the cracks.

Cracks in absorber layers are detrimental to the performance of photovoltaic devices. Absorber layers containing cracks are normally discarded, contributing to decreased yield and higher costs. Therefore, a method that allows utilizing a crack-containing thin film as the absorber layer in photovoltaic devices remains needed.

BRIEF SUMMARY

The present application provides a method to fabricate a photovoltaic device with a crack-containing absorber layer that is normally discarded. After forming an absorber layer containing cracks over a back contact layer, a passivation layer is formed over a top surface of the absorber layer and interior surfaces of the cracks. The passivation layer is deposited in a manner such that that the cracks in the absorber layer are fully passivated by the passivation layer. An emitter layer is then formed over the passivation layer to pinch off upper portions of the cracks, leaving voids in lower portions of the cracks. Degraded electrical performance in the vicinity of the cracks can thus be eliminated.

In one aspect, a photovoltaic device is provided. The photovoltaic device includes an absorber layer containing at least one crack located over a back contact layer, a passivation layer located over a top surface of the absorber layer and an entire interior surface of the at least one crack and an emitter layer located over a portion of the passivation layer that is located over the top surface of the absorber layer and another portion of the passivation layer that is located in an upper portion of the at least one crack.

In another aspect, a method of forming a photovoltaic device is provided. The method includes forming an absorber layer over a back contact layer. The absorber layer contains at least one crack. A conformal passivation layer is then formed over a top surface of the absorber layer and an entire interior surface of the at least one crack. Next, an emitter layer is formed over a portion of the passivation layer that is located over the top surface of the absorber layer and another portion of the passivation layer that is located in an upper portion of the at least one crack.

DETAILED DESCRIPTION

Figure 1:
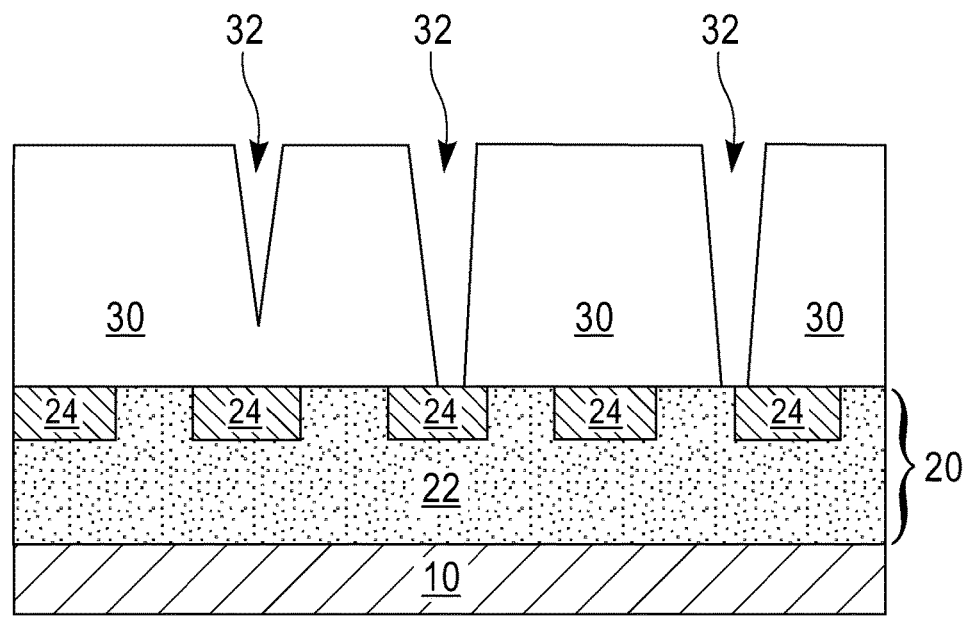
FIG. 1 is a cross-sectional view of an exemplary semiconductor structure including an absorber layer containing cracks formed over a back contact layer located on a substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes a material stack formed on a substrate 10. The material stack includes, from bottom to top, a back contact layer 20 and an absorber layer 30.

The substrate 10 may be made of a glass, a polymer such as polyimide or polyester, a metal foil, or any other material suitable for photovoltaic devices. The substrate 10 may have a thickness ranging from 10 µm to 5 mm, although lesser and greater thicknesses can also be employed.

The back contact layer 20 that is formed on a surface of the substrate 10 can be made of any electrically conductive material that forms ohmic contact with the absorber layer 30. Exemplary electrically conductive materials include, but are not limited to, molybdenum (Mo), copper (Cu), aluminum (Al), titanium (Ti), nickel (Ni), niobium (Nb), tungsten (W), and chromium (Cr). The back contact layer 20 may be formed by any conventional deposition techniques including physical vapor deposition (PVD), chemical vapor deposition (CVD), plating, printing, and spin-coating. The back contact layer 20 that is formed may have a thickness from 300 nm to 1.0 µm, although lesser and greater thicknesses can also be employed.

In one embodiment and as shown in FIG. 1, the back contact layer 20 is a localized back contact including a dielectric layer 22 containing a plurality of metal contacts 24 in direct contact with a back surface of the absorber layer 30. The dielectric layer 22 may function as a passivation layer, and may be composed of an oxide, nitride or oxynitride, for example, silicon oxide or silicon nitride. The dielectric layer 22 may be formed on the surface of the substrate 10 utilizing any conventional deposition process such as, for example, CVD, plasma enhanced chemical vapor deposition (PECVD) or PVD. The dielectric layer 22 that is formed may have a thickness from 100 nm to 1,000 nm, although lesser and greater thicknesses can also be employed.

Following the formation of the dielectric layer 22, the dielectric layer 22 is subsequently patterned by lithography (applying a photoresist, exposing the applied photoresist to a desired pattern of radiation and development) and etching (dry etching, wet etching or a combination thereof) to provide openings (not shown) within the dielectric layer 22 within which the metal contacts are subsequently formed.

Next, a conductive metal is deposited within the openings utilizing a PVD process, such as sputtering or plating, to provide the metal contacts 24. In one embodiment, the metal contacts 24 may be composed of aluminum.

The absorber layer 30 includes a semiconductor material that can readily absorb photons to generate charge carriers, i.e., free electrons or holes. The semiconductor material that provides the absorber layer 30 typically is a crystalline semiconductor material, such as a single crystal crystalline or a polycrystalline semiconductor. The absorber layer 30 can be formed from Si, Ge, SiGe, SiC, SiGeC, or a compound semiconductor material such as GaAs, CIGS or CdTe. In one example, the absorber layer 30 is composed of single crystalline Si. The thickness of the absorber layer 30 is typically less than 50 µm.

The absorber layer 30 is doped with a dopant of a first conductivity type, which can be p-type or n-type. As used herein, "p-type" refers to the addition of impurities to an intrinsic semiconductor that creates deficiencies of valence electrons (i.e. holes). In a silicon-containing absorber layer 30, examples of p-type dopants, i.e., impurities, include but are not limited to, boron, aluminum, gallium and indium. As used herein, "n-type" refers to the addition of impurities that contributes free electrons to an intrinsic semiconductor. In a silicon-containing absorber layer 30, examples of n-type dopants, i.e., impurities, include but are not limited to, antimony, arsenic and phosphorous. The dopant concentration in the absorber layer 30 can range from $1\times10^{18}$ atoms/$cm^3$ to $5\times10^{20}$ atoms/$cm^3$, although lesser and greater dopant concentrations can also be employed.

In one embodiment, the absorber layer 30 can be formed over the back contact layer 20 by smart cut or epitaxial layer transfer known in the art. In another embodiment, the absorber layer 30 can be formed by a spalling process in which a thin film providing the absorber layer 30 is spalled from a base substrate. In one embodiment, the absorber layer 30 can be formed by a controlled spalling process, such as disclosed in U.S. Patent Application Publication No. 2010/0307591, which is incorporated by reference herein. A controlled spalling process is a layer transfer technology that uses mechanically guided fracture to separate a surface layer from a base substrate. The spalling process works by first forming a stress layer, e.g., a Ni layer, on a surface of a base substrate. A handle substrate is then attached to the surface of the stressor layer. By using the handle substrate and the tensile stress contained in the stressor layer to initiate fracture within the base substrate, the surface layer with a controlled thickness can be removed from the base substrate. The surface layer can be subsequently bonded to the back contact layer 20 providing the absorber layer 30.

During formation and handling of the absorber layer 30, thermal and mechanical stresses may cause cracks 32 to develop in the absorber layer 30. In one embodiment and as shown in FIG. 1, some cracks 32 may extend through an entire thickness of the absorber layer 30 such that the back contact layer 20 is exposed at the bottom of the cracks 32.

Figure 2:
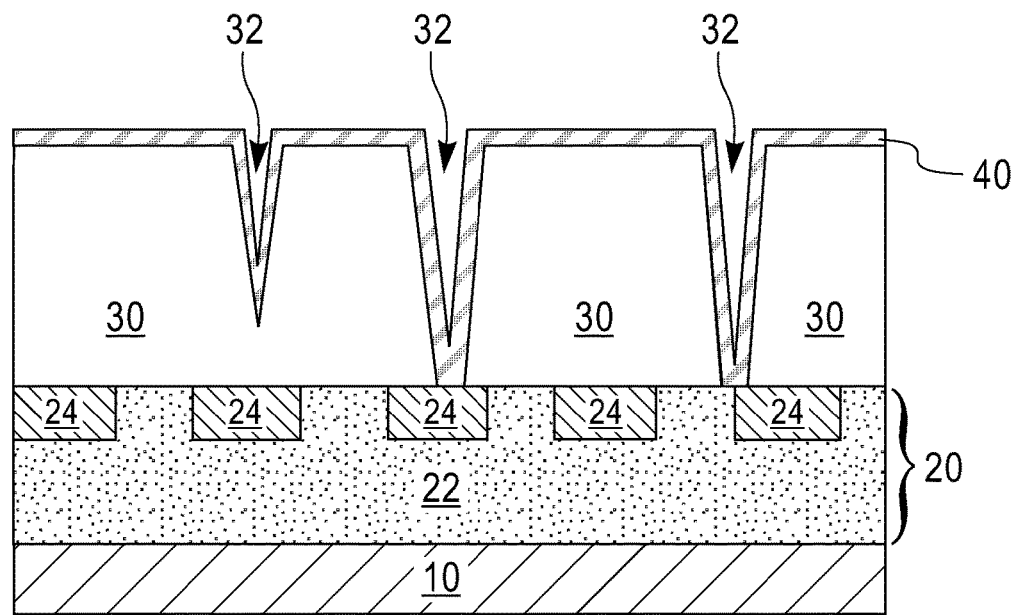
FIG. 2 is a cross-sectional view of the exemplary semiconductor structure of FIG. 1 after forming a passivation layer over the absorber layer lining entire interior surfaces of the cracks.

Referring to FIG. 2, a passivation layer 40 is conformally deposited on the top surface of the absorber layer 30 as well as interiors surfaces of the cracks 32 located inside the cracks 32. The passivation layer 40 can serve to passivate the exposed surfaces of the absorber layer 30, and reduce electron-hole recombination. The passivation layer 40 may be comprised of an intrinsic semiconductor material. The semiconductor material that provides the passivation layer 40 is typically, but not necessarily always, hydrogenated. In one embodiment, the passivation layer 40 is composed of hydrogenated silicon (Si:H). In some embodiments of the present application, the passivation layer 40 with Si:H may include dopants such as, for example, silicon, carbon, germanium, deuterium or combinations thereof.

An extremely conformal deposition process can be employed to provide the passivation layer 40 with a high thickness uniformity and 100% conformal step coverage, that is, the passivation layer 40 covers the top surface of the absorber layer 30 as wells the exposed surfaces of the cracks 32 evenly. As used herein, the "step coverage" is defined as the amount of deposition at the top surface of the substrate as a ratio of the amount of deposition at lower or more distant portions of the openings (i.e., cracks). Exemplary conformal deposition processes can be employed in the present application include, but are not limited to, molecular layer deposition (MLD), atomic layer deposition (ALD), low-pressure chemical vapor deposition (LPCVD), and rapid thermal chemical vapor deposition (RTCVD). The passivation layer 40 that is formed can have a thickness ranging from 5 nm to 50 nm, although lesser and greater thicknesses can also be employed.

Figure 3:
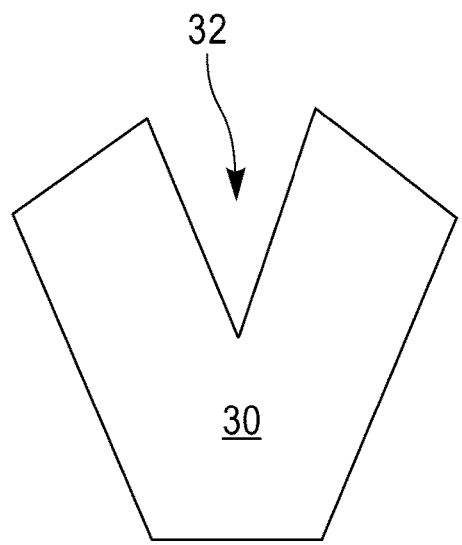
FIG. 3 illustrates a crack with an increased interior volume after flexing the absorber layer to open up the crack.

In some embodiments of the present application, to ensure the complete coverage of the interior surfaces of the cracks 32 by the passivation layer 40 so as to eliminate a high conductivity leakage path to the back of the PV cell due to the presence of the cracks 32, during the deposition of material providing the passivation layer 40, the absorber layer 30 may be flexed to open up the cracks 32, thereby allowing full access to the interior surfaces of the cracks 32. As illustrated in FIG. 3, after flexing the absorber layer 30 to widen a crack 32, the interior volume of the crack 32 is increased. The entire interior surface of each of the cracks 32 thus becomes more accessible for ease of deposition of the passivation layer 40. As a result, the passivation layer 40 can be readily conformed to the entire interior surfaces of the cracks 32. It should be noted that in the present application once the pattern of cracks is formed, the flexing of the absorber layer 30 does not generate more cracks, but acts only to widen the existing cracks 32. After passivating the entire interior surfaces of the cracks 32, the absorber layer 30 is unflexed to allow the cracks 32 returning to the original dimensions.

Figure 4:
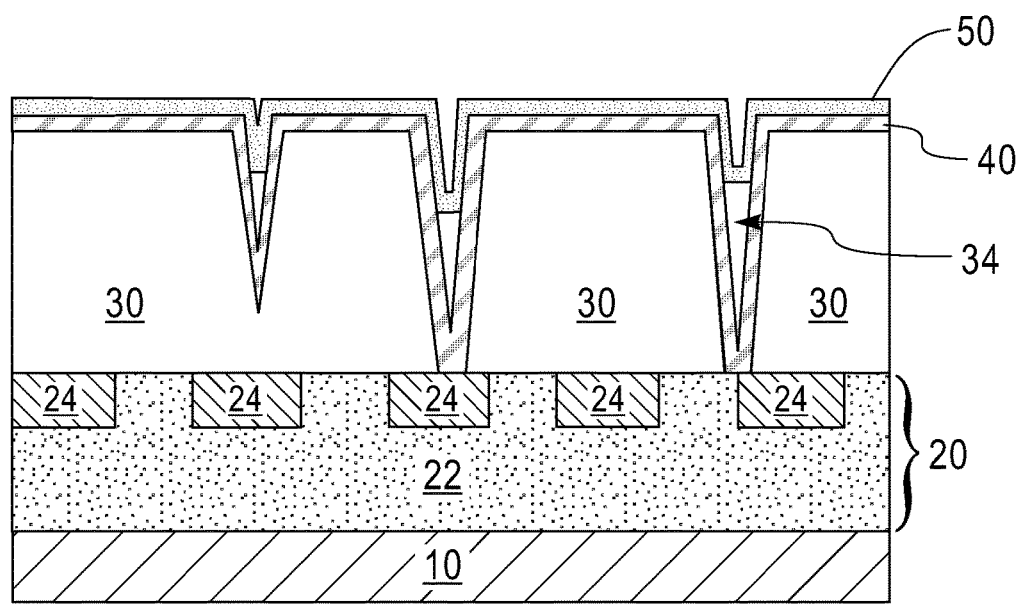
FIG. 4 is a cross-sectional view of the exemplary semiconductor structure of FIG. 2 after forming an emitter layer over the passivation layer.

Referring to FIG. 4, an emitter layer 50 is formed over the passivation layer 40. The emitter layer 50 may include Si, Ge, SiGe, SiC, or SiGeC, or a compound semiconductor material such as GaAs and may or may not contain hydrogen. The emitter layer 50 typically has a conductivity type that is opposite the conductivity type of the absorber layer 30. For example, when the absorber layer 30 is doped to a p-type conductivity, the emitter layer 50 is doped to an n-type conductivity, and when the absorber layer 30 is doped to an n-type conductivity, the emitter layer 50 is doped to a p-type conductivity. The dopant concentration in the emitter layer 50 can range from $1 \times 10^{18}$ atoms/cm$^3$ to $1 \times 10^{21}$ atoms/cm$^3$, although lesser and greater dopant concentrations can also be employed. In one embodiment and when the absorber layer 30 is composed of p-type silicon, the emitter layer 50 can include n-doped hydrogenated silicon.

The deposition of the emitter layer 50 is controlled such that the semiconductor material providing the emitter layer 50 only deposits on the top and other well-exposed surfaces of the passivation layer 40 in the upper portions of the cracks 32. The emitter layer 50 thus seals the cracks 32, leaving voids 34 within the cracks 32. The voids 34 prevent direct contact between the emitter layer 50 and the back contact layer 20, thereby avoiding electrical shorts.

Figure 5:
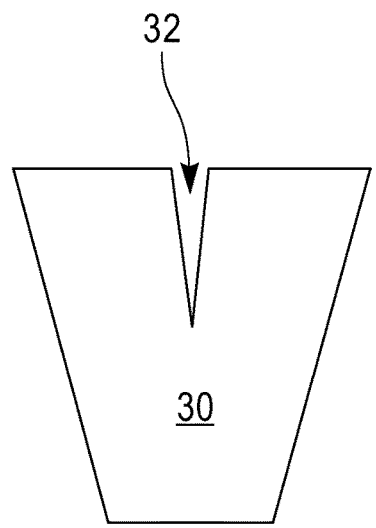
FIG. 5 illustrates a crack with a decreased interior volume after flexing the absorber layer to close up the crack.

The emitter layer 50 may be formed by a poorly conformal deposition process such as, for example, PECVD such that the resulting emitter layer 50 only slightly penetrates into the cracks 32 to partially fill the upper portions of the cracks 32. The deposition can be performed at a temperature ranging from 200° C. to 250° C. In some embodiments of the present application and as shown in FIG. 5, during the deposition of the semiconductor material providing the emitter layer 50, the absorber layer 30 may be flexed to close up the cracks 32, thus making the lower portions of the cracks 32 less accessible to the deposited semiconductor material. As a result, the emitter layer 50 pinches off the cracks 32 in the upper portions, preventing further material from entering the deeper portions of the cracks 32. The thickness of the emitter layer 50 that is formed can be from 1 nm to 50 nm, although lesser and greater thicknesses can also be employed.

The dopant can be introduced into the emitter layer 50 using an in-situ doping process. The in-situ doping of the emitter layer 50 can be affected by adding a dopant gas into a process chamber containing a semiconductor precursor source gas and a carrier gas including hydrogen employed to provide the emitter layer 50.

A single junction such as a p-i-n type photovoltaic device comprising a vertical stack of, from bottom to top, a p-doped absorber layer 30, an intrinsic passivation layer 40 and an n-doped emitter layer 50 is thus formed.

Figure 6:
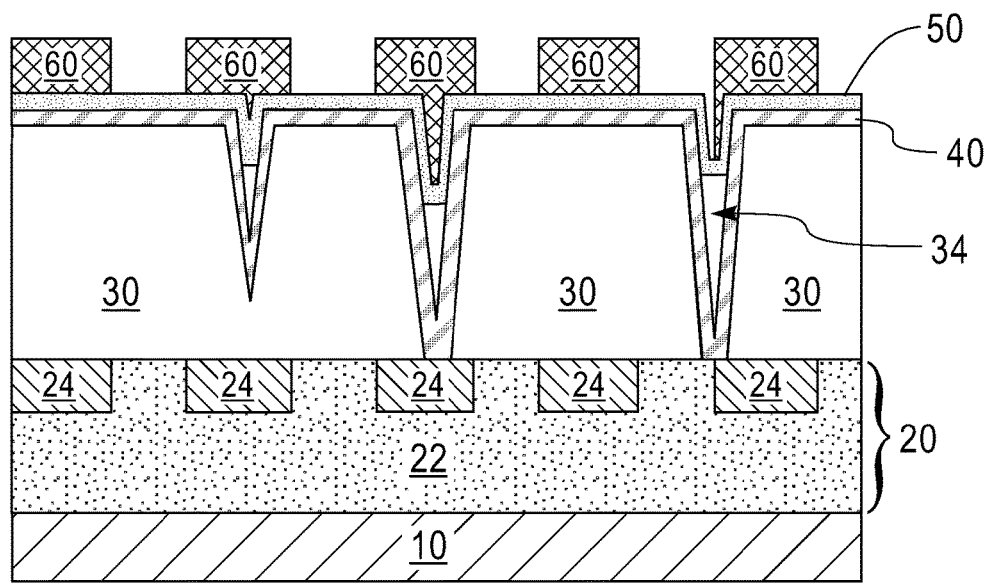
FIG. 6 is a cross-sectional view of the exemplary semiconductor structure of FIG. 4 after forming a front contact over the emitter layer.

Referring to FIG. 6, a front contact 60 is formed over the emitter layer 50. In one embodiment and as shown in FIG. 6, the front contact 60 consists of a set of parallel narrow finger lines. In one embodiment, the front contact 60 may be deposited with a screen printing technique. In another embodiment, the front contact 60 is provided by the application of an etched or electroformed metal pattern. The metallic material used in forming the metal pattern for the front contact 60 may include applying a metallic paste. The metallic paste may be any conductive paste, such as Al paste, Ag paste or AlAg paste. The metallic material used in forming the metal pattern for the front contact 60 may also be deposited using sputtering or plating. The thickness of the front contact 60 can range from 100 nm to 10 micrometers, although lesser and greater thicknesses can also be employed.

In the present application, by manipulating the deposition conditions to provide a passivation layer 40 fully passivating the cracks 32 in the absorber layer 30 and an emitter layer 50 formed in upper portions of the cracks 32 to seal the cracks 32 without contacting bottom portions of the passivation layer 40 that are in direct contact with the back contact layer 20, the direct contact between the emitter layer 50 and the back contact layer 20 is avoided. As a result, electrical shorts between the front contact 60 and the back contact layer 20 is prevented. A crack-containing absorber layer normally discarded can be utilized to fabricate high quality photovoltaic devices, thus reducing the manufacture costs.

While the present application has been particularly shown and described with respect to preferred embodiments thereof, it will be understood by those skilled in the art that the foregoing and other changes in forms and details can be made without departing from the spirit and scope of the present application. It is therefore intended that the present application not be limited to the exact forms and details described and illustrated, but fall within the scope of the appended claims.

What is claimed is:

1. A method of forming a photovoltaic device comprising:
   forming an absorber layer over a back contact layer, wherein the absorber layer comprises a crack;
   forming a conformal passivation layer over a top surface of the absorber layer and an entire interior surface of the crack; and
   forming an emitter layer over the passivation layer, wherein the emitter layer partially fills the crack and pinches off the crack such that a void is present between the emitter layer and the passivation layer within the crack.

2. The method of claim 1, wherein a portion of the passivation layer is located over the top surface of the absorber layer and another portion of the passivation layer is located along the interior surface of the crack.

3. The method of claim 1, wherein the emitter layer does not form contact with the back contact layer.

4. The method of claim 1, wherein the crack extends through an entire thickness of the absorber layer, exposing a surface of the back contact layer.

5. The method of claim 1, wherein the forming the passivation layer is performed by atomic layer deposition, molecular layer deposition, low-pressure chemical vapor deposition or rapid thermal chemical vapor deposition.

6. The method of claim 1, further comprising flexing the absorber layer outwardly prior to the forming the passivation layer to open up the crack such that access to the interior surface of the crack is increased.

7. The method of claim 6, wherein the flexing the absorber layer does not create additional cracks in the absorber layer.

8. The method of claim 6, further comprising unflexing the absorber layer after the forming the passivation layer such that the crack returns to its original dimension.

9. The method of claim 1, wherein the passivation layer has a thickness from 5 nm to 50 nm.

10. The method of claim 1, wherein the forming the emitter layer is performed by plasma enhanced chemical vapor deposition.

11. The method of claim 10, wherein the forming the emitter layer is performed at a temperature between 200° C. and 250° C.

12. The method of claim 1, further comprising flexing the absorber layer inwardly to close up the crack such that access to the interior surface of the crack is decreased prior to the forming the emitting layer.

13. The method of claim 1, wherein the absorber layer is formed by spalling or epitaxial layer transfer.

14. The method of claim 1, wherein the absorber layer is doped to a first conductivity type, the emitter layer is doped to a second conductivity type opposite to the first conductivity type, and the passivation layer is an intrinsic semiconductor layer.

15. The method of claim 1, further comprising forming a top contact over the emitter layer.

16. The method of claim 15, wherein the top contact comprises of a plurality of finger lines arranged parallel to one another.

17. The method of claim 1, wherein the absorber layer further comprises another crack extending into a portion of the absorber layer, wherein the passivation layer is located along an entire interior surface of the another crack, and the emitter layer pinches off the another crack.

18. The method of claim 1, further comprising forming the back contact layer on a substrate.

19. The method of claim 10, wherein the forming the back contact layer comprises forming a plurality of metal contacts embedded in a dielectric layer.

* * * * *